United States Patent
Kasahara et al.

(10) Patent No.: US 7,148,764 B2
(45) Date of Patent: Dec. 12, 2006

(54) COMMUNICATION SEMICONDUCTOR INTEGRATED CIRCUIT DEVICE AND A WIRELESS COMMUNICATION SYSTEM

(75) Inventors: Masumi Kasahara, Kodaira (JP); Hirotaka Osawa, Kodaira (JP); Robert Astle Henshaw, Royston (GB)

(73) Assignees: Renesas Technology Corp., Tokyo (JP); TTPCom Limited, Hertfordshire (GB)

( * ) Notice: Subject to any disclaimer, the term of this patent is extended or adjusted under 35 U.S.C. 154(b) by 0 days.

(21) Appl. No.: 10/495,611

(22) PCT Filed: Nov. 13, 2002

(86) PCT No.: PCT/GB02/05152
§ 371 (c)(1),
(2), (4) Date: Nov. 22, 2004

(87) PCT Pub. No.: WO03/044961

PCT Pub. Date: May 30, 2003

(65) Prior Publication Data
US 2005/0068111 A1   Mar. 31, 2005

(30) Foreign Application Priority Data
Nov. 16, 2001  (GB) .................................. 0127537.9

(51) Int. Cl.
*H03B 1/00*   (2006.01)

(52) U.S. Cl. ..................... 331/179; 331/177 R; 331/34; 331/1 A; 455/260; 327/156; 327/159; 327/160

(58) Field of Classification Search ................ 331/179, 331/177 R, 34, 1 A; 455/260; 327/156, 327/159, 160
See application file for complete search history.

(56) References Cited

U.S. PATENT DOCUMENTS

| | | | |
|---|---|---|---|
| 4,677,394 A | * | 6/1987 | Vollmer ....................... 331/1 A |
| 6,114,920 A | | 9/2000 | Moon et al. ................. 331/179 |
| 6,188,287 B1 | * | 2/2001 | Avanic et al. ................ 331/11 |
| 6,317,006 B1 | | 11/2001 | Welland et al. .............. 331/25 |

FOREIGN PATENT DOCUMENTS

| | | |
|---|---|---|
| EP | 1107456 A2 | 6/2001 |
| EP | 1193875 A1 | 4/2002 |

* cited by examiner

*Primary Examiner*—Arnold Kinkead
(74) *Attorney, Agent, or Firm*—Mattingly, Stanger, Malur & Brundidge, P.C.

(57) ABSTRACT

In a communication semiconductor integrated circuit device, an oscillator (VCO 10) of a PLL circuit can operate in a plurality of frequency bands. With a control voltage (Vc) of the oscillator fixed to a predetermined value (VDC), an oscillation frequency of the oscillator is measured for each band to be stored in a storage (18). When the PLL operates, a setting value to specify a band is compared with the measured frequency values stored in the storage. As a result of the comparison, a band to be actually used by the oscillator is determined.

10 Claims, 5 Drawing Sheets

COMMUNICATION SEMICONDUCTOR INTEGRATED CIRCUIT DEVICE AND A WIRELESS COMMUNICATION SYSTEM

The present invention relates to a technique efficiently applicable to a phase-locked loop (PLL) circuit which includes a voltage controlled oscillator (VCO) and which can change an oscillation frequency, and to a technique to be efficiently used in an PLL circuit, a high-frequency semiconductor integrated circuit including the same, and a wireless communication system using the same in which the PLL circuit generates an oscillation signal having a predetermined frequency to be mixed with a received signal and a transmission signal in a mobile communication device such as a portable telephone to communicate, for example, multi-band signals.

In a wireless communication system such as a portable telephone, a PLL circuit is used as a local oscillator to generate an oscillation signal with a predetermined frequency to be mixed with a received signal and a transmission signal. Heretofore, there has been known a dual-band portable telephone which can operate with signals in two frequency bands, for example, Global System for Mobile Communication (GSM) in a band from 880 megaherz (MHz) to 915 MHz and Digital Cellular System (DCS) in a band from 1710 MHz to 1785 MHz. In such a dual-band portable telephone, there has been used a system in which one PLL circuit can cope with two frequency bands by changing the frequency of the PLL circuit.

Recently, however, a need exists for a triple-band portable telephone which can operate with signals in a personal communication system in a frequency band from 1850 MHz to 1915 MHz in addition to GSM and DCS. It can be considered that a portable telephone to operate with four or more frequency bands will be required in future.

For a high-frequency semiconductor integrated circuit (to be referred to as a high-frequency LSI hereinbelow) which modulates a transmission signal and which demodulates a received signal in such a portable telephone coping with a plurality of bands, a direct conversion system is efficient in consideration of reduction in the number of parts of the circuit. However, although the direct conversion system can relatively easily cope with a plurality of bands, the range of frequencies which can be oscillated by the VCO becomes wider. When it is attempted to cope with all frequencies by one VCO, sensitivity of the VCO with respect to a control voltage thereof becomes higher. This results in a disadvantage that the VCO is weak against or is easily influenced by noise and a change in the power source voltage.

On the other hand, to reduce the number of parts of the device, it is efficient to form the VCO, which is in general supplied as one module independently of a high-frequency LSI in the prior art, on a semiconductor chip together with the high-frequency LSI. However, in the on-chip VCO, the variation in the absolute value of the oscillation frequency becomes greater because of adverse factors in the manufacturing of the device. Therefore, a function to adjust the oscillation frequency after the production of the device is inevitable. When the adjustment of the variation in the absolute value of the oscillation frequency is conducted by a general procedure used for semiconductor integrated circuits of the prior art, namely, by the mask option, the bonding wire option, or the trimming, the production cost inevitably becomes higher.

Preferably it is therefore an object of the present invention to provide a communication semiconductor integrated circuit (high-frequency LSI) including a PLL circuit in which the sensitivity of the VCO with respect to the control voltage is not increased and which is not easily influenced by external noise and a variation in the power source voltage even when the range of frequencies which can be oscillated by the VCO is expanded to cope with a plurality of bands.

Preferably another object of the present invention is to provide a communication semiconductor integrated circuit (high-frequency LSI) in which the variation in the oscillation frequency of the VCO can be automatically corrected by an internal circuit.

Preferably still another object of the present invention is to provide a communication semiconductor integrated circuit (high-frequency LSI) which can conduct communication using signals in a plurality of frequency bands and in which the VCO can also be formed on the semiconductor chip of the high-frequency LSI to thereby reducing the number of parts thereof.

The above and other objects and novel features of the present invention will become more apparent from the consideration of the following detailed description taken in conjunction with the accompanying drawings.

Representative aspects of the present invention disclosed by this application will be described below.

According to one aspect of the present invention, an oscillator circuit constituting a PLL circuit can operate in a plurality of frequency bands. With a control voltage of the oscillator circuit fixed to a predetermined value, an oscillation frequency of the oscillator circuit is measured in each frequency band and is stored in a storage circuit. A setting value indicated at operation of the PLL circuit to specify a frequency band is compared with the measured value of the associated frequency stored in the storage circuit. According to a result of the comparison, a frequency band actually used by the oscillator circuit is determined. Preferably, a period of a reference oscillation signal is used as a measuring time of the oscillation frequency. More preferably, a counter originally disposed in the PLL circuit to operate as a frequency dividing circuit is used to measure the oscillation frequency.

According to the aspect, the sensitivity of the oscillator circuit represented by a ratio ($\Delta f/\Delta fVc$) between a variation in the frequency and a variation in the control voltage can become appropriate or mild, namely, not excessively high. Therefore, the PLL circuit is strong against noise, and it is not necessary to establish a one-to-one correspondence between a specified band value and a frequency band of the oscillator circuit in advance. It is only necessary to select a value corresponding to each specified band value according to the actual characteristic detected by the measurement. It is therefore not required to conduct the frequency matching or adjustment for the oscillator circuit.

BRIEF DESCRIPTION OF THE DRAWINGS

The objects and features of the present invention will become more apparent from the consideration of the following detailed description taken in conjunction with the accompanying drawings in which.

DESCRIPTION OF THE EMBODIMENTS

Description will now be given of an embodiment of the present invention.

Figure 1:
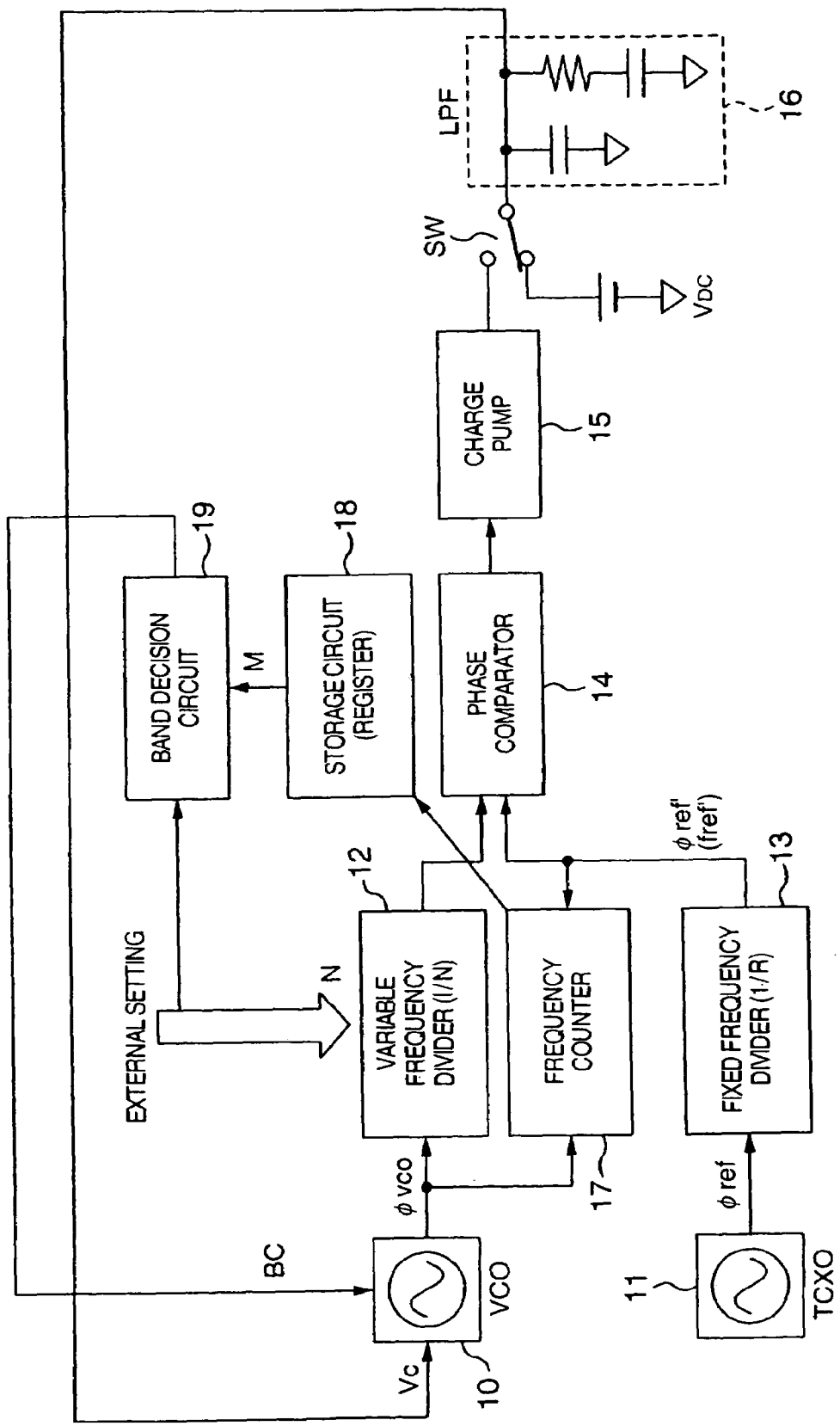
FIG. 1 is a block diagram showing a first embodiment of a PLL circuit according to the present invention.

FIG. 1 shows a first embodiment of a PLL circuit in which a frequency band can be automatically selected according to the present invention. The configuration of FIG. 1 includes a voltage controlled oscillator (VCO) 10, a reference oscillator circuit (TCXO) 11 including a quartz crystal oscillator to oscillate a frequency with high precision, a variable frequency dividing circuit 12 to divide an oscillation signal ϕvco of the VCO 10 by N, a fixed frequency dividing circuit 13 to divide an oscillation signal ϕref of the reference oscillator circuit 11 by R (N and R are positive integers), a phase comparator 14 which compares a phase of a signal divided by the variable frequency dividing circuit 12 with a phase of a signal divided by the fixed frequency dividing circuit 13 to output a voltage UP or DOWN according to a phase difference therebetween, a charge pump 15, and a loop filter 16. The charge pump 15 charges up a capacitance element of the loop filter 16 and a signal produced as a result of the charging operation is outputted as a control voltage Vc of the VCO 10. Thus, a PLL loop is configured.

The variable frequency dividing circuit 12 can divide an oscillation signal of the VCO 10 by an arbitrary dividing factor N according to a value externally set thereto. The oscillation frequency of the VCO 10 is controlled such that a frequency of a signal divided by the variable frequency dividing circuit 12 is equal to a frequency of a signal obtained from the fixed frequency dividing circuit 13 by dividing the reference oscillation signal ϕref of the reference oscillator circuit 11 by R. The configuration described up to this point is similar to that of the general PLL circuit of the prior art.

The PLL circuit of this embodiment includes: as shown in FIG. 1, a switch SW between a charge pump 15 and a loop filter 16 to supply a predetermined direct-current (dc) voltage VDC, in place of a voltage Vc from the charge pump 15, to the loop filter 16; a frequency counter 17 to count the oscillation signal of the VCO 10; a storage circuit 18 including, for example, a register(s) to store the value counted by the frequency counter 17; a band decision circuit 19 which compares the frequency value stored in the storage circuit 18 with a setting value N externally set to the variable frequency dividing circuit 12 to generate a band switch or change signal BC for the VCO 10; and a control circuit (refer to block 20 in FIG. 4; block 290 in FIG. 6) to control the switch SW, the frequency counter 17, the storage circuit 18, and the band decision circuit 19. The dc voltage VDC may take a voltage value within a valid variable range of the control voltage Vc. In general, an upper limit value or a lower limit value of the variable range of the control voltage Vc is selected. The dc voltage VDC is kept unchanged during the frequency measurement even when the frequency band is changed.

The VCO 10 includes, for example, a Colpitts oscillator including an LC resonance circuit. A plurality of capacitance elements constituting the LC resonance circuit are arranged in a parallel connection with a switching element therebetween. By selectively turning each switching element by the band change signal BC, the number of capacitance elements connected to each other, that is, the value of C of the LC resonance circuit is changed. Therefore, the oscillation frequency can be stepwise changed. On the other hand, the VCO 10 includes a variable capacitance diode (varactor) as a variable capacitance element. The value of capacitance of the variable capacitance diode is changed by the control voltage Vc from the loop filter 16, and hence the oscillation frequency is continuously changed.

Figure 2A:
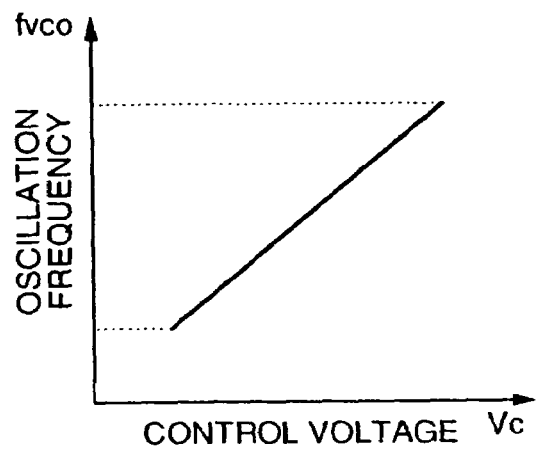
FIGS. 2A and 2B are graphs showing relationships between a control voltage Vc and an oscillation frequency fvco respectively in a case in which the variable range of VCO frequency is continuously changed in the PLL circuit according to the present invention and in a case in which the variable range of VCO frequency is changed for each band in the PLL circuit according to the present invention.

To expand the frequency range of the VCO 10, when only the capacitance value of the variable capacitance diode is changed by the control voltage Vc, the Vc-fvco characteristic becomes steep as shown in FIG. 2A and the sensitivity of the VCO 10 represented by a ratio (Δf/ΔfVc) between a variation in the frequency and a variation in the control voltage becomes greater, and hence the VCO 10 is weak against noise. That is, only when the control voltage slightly includes noise, the oscillation frequency fvco (ϕvco) of the VCO 10 is remarkably changed.

Figure 2B:
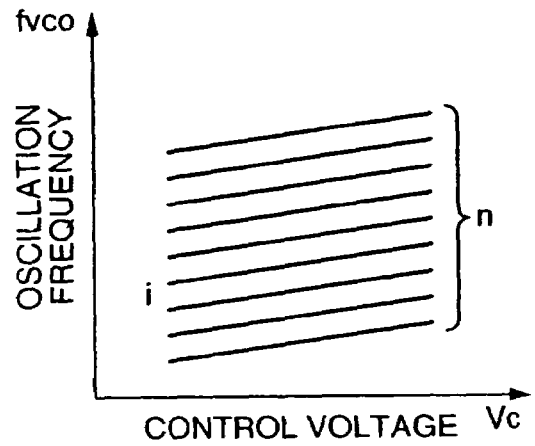

To overcome the difficulty, the VCO 10 of this embodiment includes a plurality of capacitance elements constituting the LC resonance circuit are arranged in a parallel connection. The capacitance elements to be actually used are changed in n stages by the band change signal BC to thereby change the value of C. As a result, the oscillation can be controlled along a plurality of Vc-fvco characteristic lines as shown in FIG. 2B. In this embodiment, by disposing the frequency counter 17, the storage circuit 18, and the band decision circuit 19, the regulating operation of frequency matching or adjustment conducted in the PLL circuit of the prior art becomes unnecessary.

That is, in the PLL circuit of the prior art, also when a VCO has a plurality of Vc-fvco characteristic lines as shown in FIG. 2B, the VCO is operated to measure frequencies to conduct the frequency matching such that each Vc-fvco characteristic line has a predetermined initial value and a predetermined gradient. In contrast thereto, in the PLL circuit of the embodiment, a predetermined dc voltage VDC is applied to the VCO 10 by beforehand activating the switch SW to measure a frequency in each band to store the frequency in the storage circuit 18. In an actual operation, a setting value N corresponding to a specified band externally indicated to the variable frequency dividing circuit 12 is compared with the measured value stored in the storage circuit 18. According to a result of the comparison, one of the Vc-fvco characteristic lines as shown in FIG. 2B is selected, the selected line covering the frequency range of the specified band. The VCO 10 is changed (by switching the capacitance elements) to control the oscillation along the characteristic line.

According to this method, by beforehand slightly expanding, in consideration of the variation, the frequency range to be covered and by designing the VCO such that the frequency ranges slightly overlap between the adjacent n-stage Vc-fvco characteristic lines shown in FIG. 2B (desirably, a half of each Vc-fvco characteristic line overlaps with an adjacent Vc-fvco characteristic line), there always exists a Vc-fvco characteristic line to cover the specified band. Therefore, it is only necessary to select a Vc-fvco characteristic line corresponding to the specified band according to an actual characteristic recognized by the measurement. It is consequently not necessary to conduct the frequency matching or adjustment. Moreover, it is not required to beforehand establish a one-to-one correspondence between the bands to be used and the VCO states to be changed.

Additionally, to measure the oscillation frequency in this embodiment, the start and the end of the counting operation of the frequency counter 17 are controlled by the signal φref' obtained by dividing the reference oscillation signal φref so that the frequency counter 17 conducts the counting for one period of φref. Resultantly, any complex operation is not necessary for the measurement. That is, originally, to exactly obtain the oscillation frequency of the VCO 10, it is necessary to count by a counter the number of clocks per second of the VCO 10 or it is necessary that the system first counts clocks for a predetermined period of time and then executes operation to convert the obtained count value into a frequency per second. However, when the variable frequency dividing circuit 12 is disposed to divide the oscillation signal φvco of the VCO 10 by N as in the PLL circuit shown in FIG. 1, it is only necessary to store in a memory a count value of one period of φref' of the frequency counter 17 for each band. Only by comparing these count values with a setting value N externally supplied to the variable frequency dividing circuit 12, it is possible to determine one of the Vc-fvco characteristic lines for the operation of the VCO 10.

Assume that an operation is conducted as below. A band i is selected by a dc voltage VDC and the VCO 10 accordingly operates to generate an oscillation signal φvcoi. The frequency counter 17 conducts the count operation only for one period of φref', and the resultant count value is Mi. In this situation, since the period T of φref' is T=1/fref', the frequency fvcoi of the oscillation signal φvcoi is expressed as below.

$$fvcoi = Mi/T = Mi \cdot fref' \quad (1)$$

On the other hand, when N is set to the variable frequency dividing circuit 12 and the PLL circuit conducts the feedback operation, the oscillation signal φvco of the VCO 10 is represented as follows.

$$\phi vco = N \cdot fref' \quad (2)$$

Therefore, by selecting a band i for which Mi is in the neighborhood of N according to expression (1) and (2), the VCO 10 can generate an oscillation signal having a desired frequency.

Figure 3:
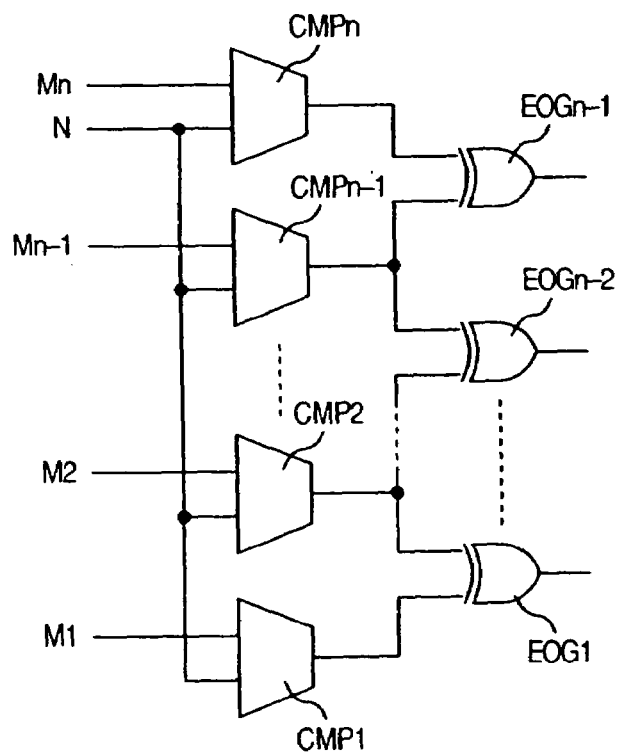
FIG. 3 is a logic circuit diagram showing a configuration example of a band decision circuit in an embodiment of the PLL circuit according to the present invention.

As above, it can be readily understood that the band decision circuit 19 can be easily constructed using a comparator which compares a value N externally set to the variable frequency dividing circuit 12 with the measured values Mi stored in the storage circuit 18 and a circuit which produces an exclusive logical sum of a result of the comparison conducted by the comparator. To obtain a result of the decision by the band decision circuit 19 in a short period of time, it is only necessary to arrange comparators CMP1 to CMPn and (n-1) exclusive OR gates EOG1 to EOGn-1 according to the number n of bands which can be changed by the VCO 10 as shown in FIG. 3. According to the circuit, only the exclusive OR gate at a boundary at which the comparison result changes from a low level to a high level produces a high-level output. Therefore, it is only necessary to select the band corresponding to the output from the gate. If there exists a margin of time, it is also possible to dispose one comparator, one latch circuit to hold a result of comparison by the comparator, and one exclusive NOR gate so as to operate these elements in a time sharing fashion.

Figure 4:
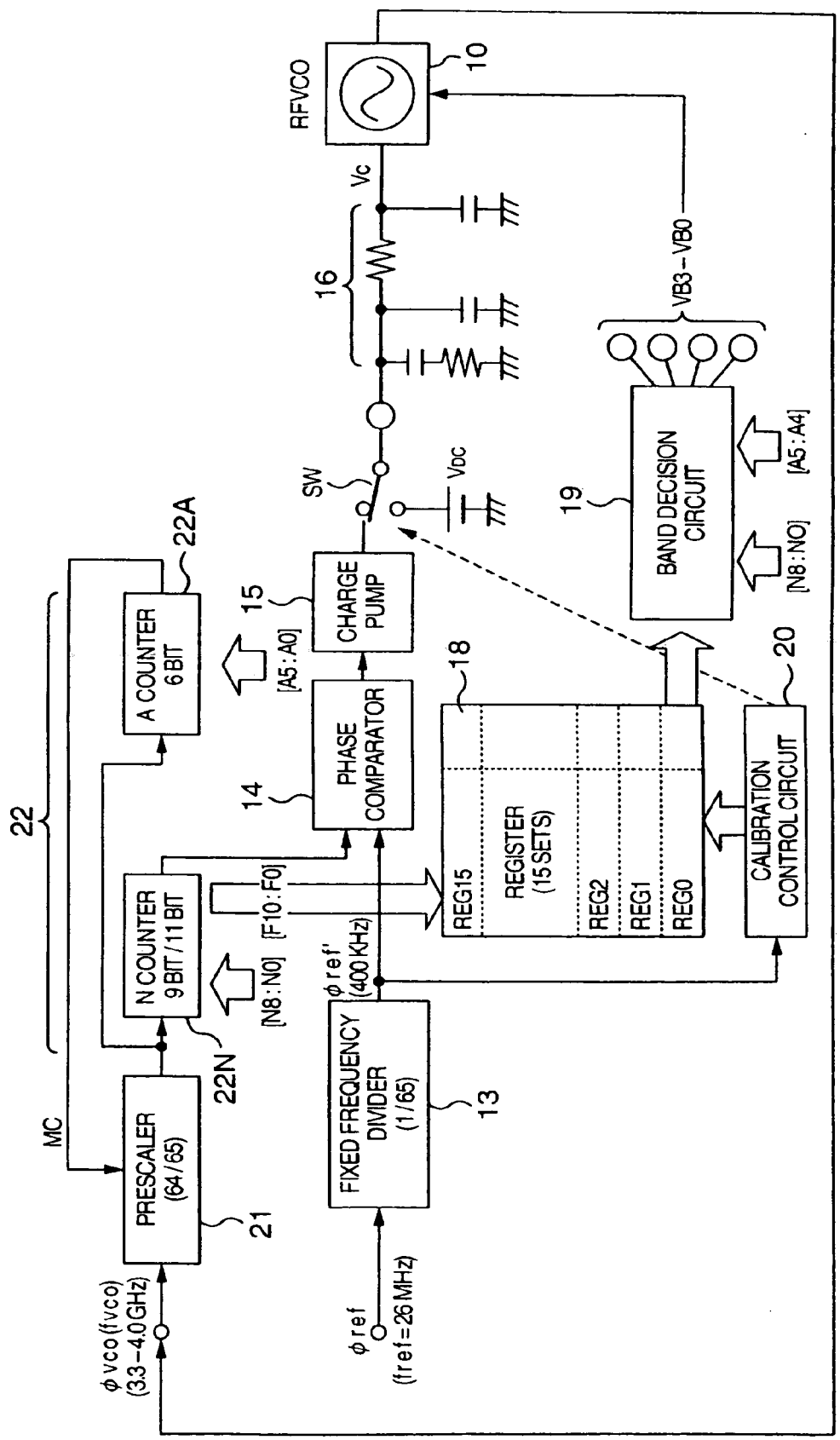
FIG. 4 is a block diagram showing a second embodiment of a PLL circuit according to the present invention.

Next, referring to FIG. 4, description will be given of a second embodiment of the PLL circuit of the present invention. In FIG. 4, the same or equivalent circuit blocks as those of FIG. 1 will be assigned with the same reference numerals and the duplicated description thereof will be avoided.

The PLL circuit of this embodiment includes, in place of the variable frequency dividing circuit 12 of the first embodiment, a prescaler 21 to divide an oscillation signal of the VCO 10 and a modulo counter 22 including a first counter 22N and a second counter 22A which further divide the divided signal from the prescaler 21, and the first counter 22N also conducts the operation of the frequency counter 17 of the first embodiment.

By combining the prescaler 21 with the modulo counter 22, the overall frequency dividing circuit can be constructed in a compact size. That is, the prescaler 21 is a fixed counter and hence is configured using an emitter coupled logic (ECL) circuit for the speedup of operation to count high-frequency signals. The signal divided by the high-speed prescaler 21 is counted by the modulo counter 22 including a complementary metal-oxide semiconductor (CMOS) circuit. The CMOS circuit is slower in the operation speed than the ECL circuit, but can be integrated with a higher integration degree than the ECL circuit. Therefore, it is possible to implement the frequency dividing circuit with desired performance and in a small area.

The frequency dividing operation by the prescaler 21 and the modulo counter 22 is a known technique. The prescaler 21 is constructed for two kinds of frequency dividing with two different dividing ratios, for example, to divide a frequency by 64 and 65. The switching operation between these different ratios is conducted by a count end signal of the second counter 22A. The first counter 22N and the second counter 22A are programmable counters. The first counter 22N is set to an integer part of a result of a division in which a desired frequency (the oscillation frequency fvco of the VCO for a desired output) is divided by the frequency fref' of the reference frequency signal φref' and the first dividing ration (64 in the embodiment) of the prescaler 21. The second counter 22A is set to a remainder (MOD) of the result. When the value thus set is counted, the count operation is finished. Thereafter, a counting operation of a setting value is achieved.

Assume a concrete example in which the frequency ref' of the reference frequency signal φref' is 400 kiloherz (kHz) and the desired oscillation frequency fvco of the VCO is 3789.6 MHz. In this case, 3789.6÷0.4=148 with a remainder of 2. That is, the value N set to the first counter 22N is 148 and the value A set to the second counter is 2. In a state in which these values are set to the counters, when the prescaler 21 and the modulo counter 22 start operation, the prescaler 21 first divides the frequency by 64. When the second counter 22A counts the output from the prescaler 21 and the count value becomes 2, the second counter 22A outputs a count end signal MC. This signal MC changes the operation of the prescaler 21, and the prescaler 21 divides the frequency by 65 until the second counter 22A counts the setting value "2".

In the operation, the modulo counter 22 can divide the frequency by a ratio including an integer part and a fractional part, not by a ratio of an integer. In the PLL of the embodiment, to control the oscillation of the VCO 10, a feedback operation is conducted such that the frequency of the output from the first counter 22N matches the frequency fref' (400 kHz) of the reference frequency signal φref'. In consequence, in the above case in which the value N set to the first counter is "148" and the value A set to the second counter 22A is "2", the oscillation frequency fvco of the VCO is calculated as follows.

$$fvco=(64\times148+2)\times fref'=9474\times400=3789600$$

The frequency fvco is therefore 3789.6 MHz.

Since the first counter 22N and the second counter 22A actually includes binary counters, the value N set to the first counter 22N and the value A set to the second counter 22A are specified in the form of a binary code. In this embodiment, although not particularly limited to, the first counter 22N operates as a 9-bit counter and the second counter 22A operates as a 6-bit counter in the PLL operation. Therefore, the value N set to the first counter 22N is a 9-bit code including bits N8 to N0 and the value A set to the second counter 22A is a 6-bit code including bits A5 to A0.

Furthermore, to measure a frequency in this embodiment, the first counter 22N can operate as an 11-bit counter. The VCO 10 is configured to change the oscillation frequency in 16 bands, i.e., in 16 stages. To store measured frequency values of the respective bands, the storage circuit 18 includes 16 registers REG0 to REG15. The band decision circuit 19 includes an 11-bit comparator to compare the value stored in each of the registers REG0 to REG15 of the storage circuit 18 with a 9-bit code (N8 to N0) set to the first counter 22N and two high-order bits A5 and A4 of a 6-bit code (A5 to A0) set to the second counter 22A. The comparator outputs a 4-bit code (VB3 to VB0) as the band change signal BC for the VCO 10.

In the frequency measurement, the control circuit 20 generates and outputs a band change signal BC to the VCO 10 so that the VCO 10 sequentially selects 16 bands. Moreover, in the frequency measurement, the control circuit 20 makes the first counter 22N operate as an 11-bit counter and controls the first counter 22N to count the clocks for other than one period of the reference oscillation signal φref', namely, for a period longer than that of the first embodiment, for example, four periods thereof. Moreover, in the frequency measurement, the control circuit 20 stops the operation of the second counter 22A to conduct the control operation such that the dividing ratio of the prescaler 22 is not changed. As a result, the prescaler 22 conducts the frequency dividing operation to divide the frequency only by 64 in the frequency measurement.

In the embodiment, the counting operation is conducted for four periods, not for one period, of the reference oscillation signal φref' in the frequency measurement to increase the precision of the measurement. That is, since the system includes the prescaler 21, when a maximum error occurs in the measurement of one period of φref' by the counter 22N, that is, when a one-pulse count error occurs in the measurement of one period of φref' by the counter 22N, the error is multiplied by the dividing ratio "64" of the prescaler 21. Therefore, when the reference oscillation signal φref' is 400 kHz, the maximum error of the counter 22N is 25.6 NHz (=400 kHz×64). However, the error in the four-period measurement by the counter 22N is lowered to about 6.4 MHz (25.6 MHz÷4).

The 11-bit count value measured by the first counter 22N in the frequency measurement is stored in either one of the registers of the storage circuit 18. In the PLL operation, eight high-order bits of the stored value are compared by the band decision circuit 19 with the code (N8 to N0) externally set to the first counter 22N. Two low-order bits of the value stored in the register of the storage circuit 18 are regarded as a fractional part. These bits are compared by the band decision circuit 19 with two high-order bits AS and A4 of the code (A5 to A0) externally set to the second counter 22N. According to a result of the comparison between the values stored in the registers REG0 to REG15 of the storage circuit 18 and the setting code (N8 to N0) and the bits A5 and A4, a band is determined for the VCO 10. A band change code (VB3 to VB0) is accordingly generated to select the band and is supplied to the VCO 10. For the VCO 10 in a PLL circuit used in a communication system such as GSM, the bands are set according to an interval of GSM channels, for example, an interval of 400 kHz.

Figure 5:
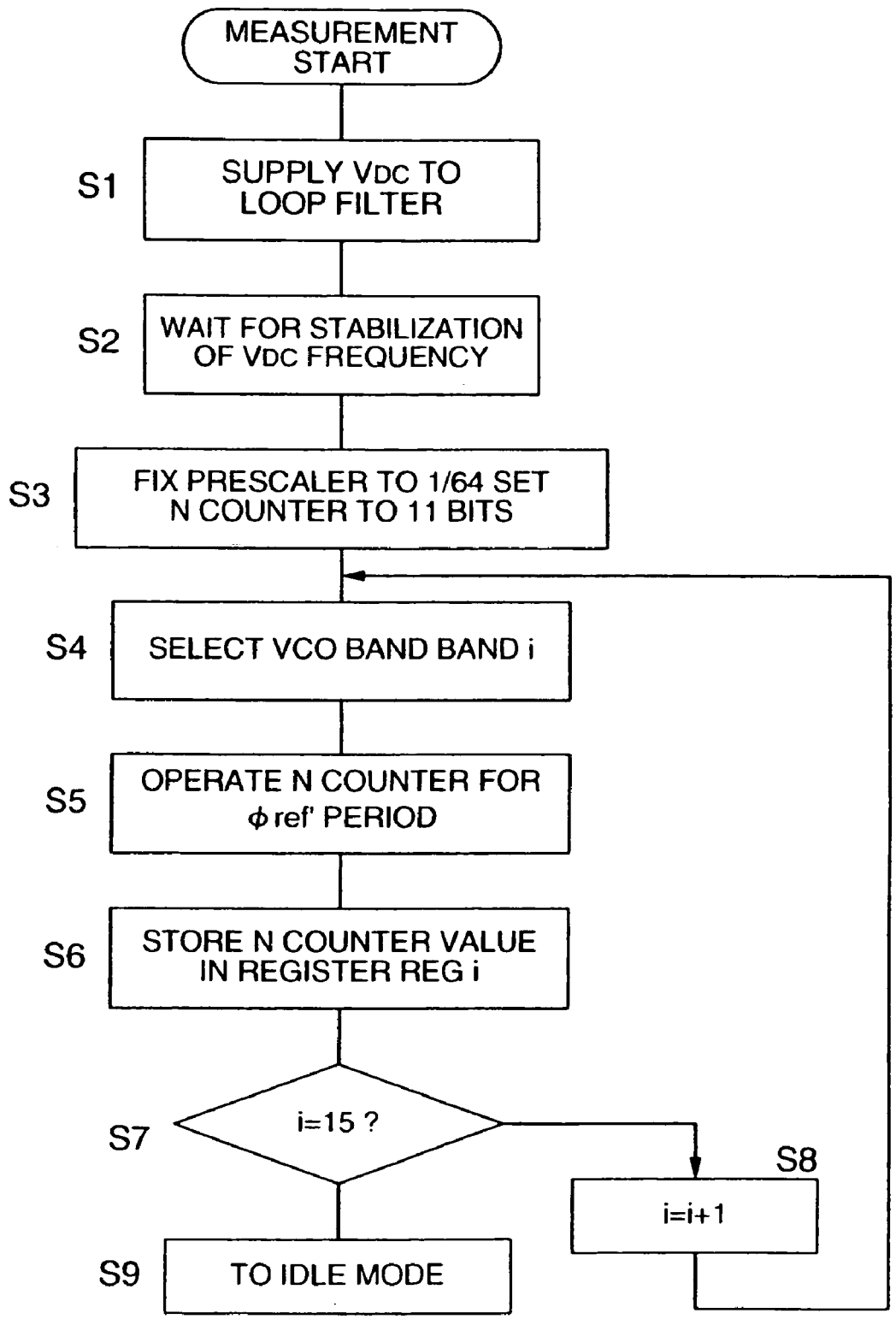
FIG. 5 is a flowchart showing an example of a frequency measuring procedure of the VCO in an embodiment of the PLL circuit according to the present invention.

Referring next to the flowchart of FIG. 5, description will be given of an operation procedure of the frequency measurement of the control circuit 20 in the PLL circuit of the embodiment.

When the frequency measurement of the RFVCO 10 is started, the control circuit 20 activates the switch SW to supply a dc voltage VDC to the loop filter 16 (step S1). The control circuit 20 awaits stabilization of the voltage Vc of the loop filter and stabilization of the oscillation frequency of the VCO 10 (step S2). Next, the control circuit 20 fixes the dividing ratio of the prescaler to 1/64 and makes the first counter 22N operate as an 11-bit counter (step S3). The control circuit 20 then refers to a pointer indicating a selected band to output a code (VB3 to VB0) to select a band for the VCO 10 (step S4). In the operation, the band first selected by the control circuit 20 is, for example, BAND0 with a lowest frequency range.

Subsequently, the control circuit 20 makes the first counter 22N conduct the count operation for four periods of the reference frequency signal φref' (step S5). In step S6, the control circuit 20 stores the count value of the counter in either one of the registers of the storage circuit 18. The register to be first used is the first register REG0. The control circuit 20 then makes a check to determine whether or not the frequency measurement has already been conducted for all bands (step S7). If there remains any band for the frequency measurement, one is added to the value of the pointer indicating the selected band in step S8. Then, control returns to step S4 to execute again operations of steps S4 to S8. When the frequency measurement is completely conducted for all bands, processing proceeds from step S7 to the idle mode of step S9, and the frequency measurement is terminated.

In the description of the embodiment shown in FIG. 3, the 11-bit count value of the first counter 22N is stored in each of the registers REG0 to REG15 of the storage circuit 18 in the frequency measurement. However, depending on the system in use, even when the band is changed, some of the bits are always in the same contents when the bits of the first counter 22N are used. In such a case, part of the bits to be transferred from the first counter 22N to the storage circuit 18 can be omitted. This reduces the number of bits of the registers in the storage circuit 18.

In the embodiment of FIG. 3, the storage circuit 18 includes 16 registers REG0 to REG15 according to 16 bands of the VCO 10. However, the register corresponding to the highest band (or the lowest band) can be omitted. When the band decision circuit 19 determines that the specified frequency does not match any one of 15 bands, only the remaining highest (or lowest) band can be used.

In the description of the embodiment of FIG. 3, the control circuit 18 makes the first counter 22N conduct the count operation for four periods of the reference frequency signal φref' in the frequency measurement. However, the count operation may be conducted for 8 or 16 periods of the signal φref'. However, the first counter 22N must be constructed as a 12-bit or 13-bit counter in this case.

Figure 6:
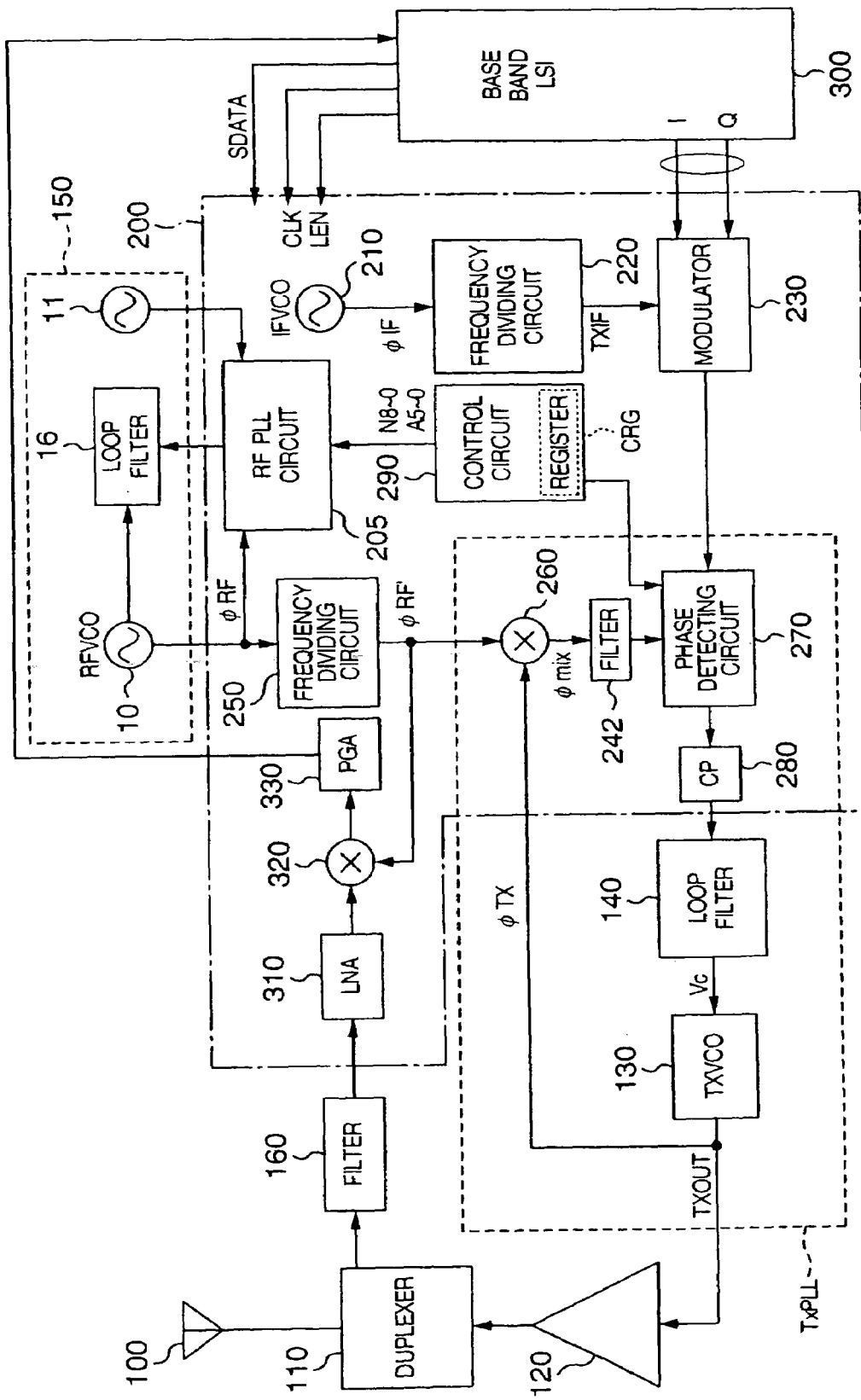
FIG. 6 is a block diagram showing a configuration example of a transmission section of a portable telephone as an example of a wireless communication system using a PLL circuit according to the present invention.

Description will now be given of a case in which a phase-locked loop (PLL) circuit of the present invention is applied to a high-frequency LSI used in a multi-band mobile communication system. FIG. 6 shows detailed constitution of a high-frequency LSI and an overall general configuration of a communication apparatus. Although not particularly limited to, the system of this embodiment is called a direct conversion system.

The configuration of FIG. 6 includes a signal wave transmitting and receiving antenna 100, a high-frequency LSI 200, a transmission/reception switching device 110, a high-frequency power amplifier circuit 120 to amplify a transmission signal, a transmission oscillator (TXVCO) 130, a loop filter 140 constituting a transmission PLL circuit, an RFVCO module 150 including a high-frequency oscillator (RFVCO) 10 to generate an oscillation signal with a frequency corresponding to a desired band and a loop filter 16, a high-frequency filter 160 to remove undesired waves from a received signal, and a baseband circuit (LSI) 300 which converts transmission data into I and Q signals and which controls the high-frequency LSI 200.

The high-frequency LSI 200 includes a transmission circuit system including an RFVCO module 150 which includes a frequency dividing circuit 13, a phase comparator circuit 14, a charge pump 15, a storage circuit 18, a band decision circuit 19, a control circuit 20, a pre-scaler 21, and a modulo counter 22 (FIG. 4) and which constitutes a PLL circuit together with the RFVCO module 150; an oscillator circuit (IFVCO) 210 to generate an oscillation signal φIF of an intermediate frequency Frf, e.g., 320 megaherz (MHz), a frequency dividing circuit 220 which divides the oscillation signal φIF from the oscillator circuit 210 to generate a carrier wave of 80 MHz, a modulator circuit 230 to directly modulate the carrier wave from the frequency dividing circuit 220 using the I and Q signals from the baseband circuit 300, a frequency dividing circuit 250 to divide an oscillation signal φRF from the high-frequency oscillator 10, a mixer 260 to mix a signal φRF' divided by the frequency dividing circuit 250 with a transmission signal φTX fed back from the transmission oscillator (TXVCO) 130 to generate a signal φmix of a frequency equivalent to a frequency difference between these signals, a harmonic filter 242 to remove a high-frequency component as a leakage signal from the mixer 260, a phase detector circuit 270 to detect a phase difference between the signal from the mixer 260 and the modulated signal from the modulator circuit 230, a charge pump 280 to conduct operation in response to a signal such as UP or DOWN from the phase detector circuit 270, and a mode control circuit 290.

Although not particularly limited to, in this embodiment, an RF synthesizer including the RFVCO 150 and the RF PLL circuit 205 is shared between the circuits of the transmission section and the circuits of the reception section. The high-frequency LSI 200 includes a reception circuit system including a low-noise amplifier 310 to amplify a received signal, a demodulator circuit 320 to conduct signal demodulation by mixing the received signal with a signal produced from the frequency dividing circuit 250 by dividing the oscillation signal φRF from the high-frequency oscillator 10, and a programmable gain amplifier 330 which amplifies and outputs the demodulated signal to a baseband circuit 300.

In this embodiment, a transmission PLL circuit TxPLL to conduct frequency conversion includes a charge pump 280, a phase detector circuit 270, a loop filter 140, a transmission oscillator (TXVCO) 130, and a mixer 260. In a multiband mobile communication system, the oscillation frequency φRF of the high-frequency oscillator 10 is changed, for example, by the baseband circuit 300 according to a band to be used. This resultantly changes the transmission frequency.

The control circuit 290 includes a control register CRG. The register CRG is set according to a signal from the baseband circuit 300. Specifically, the baseband circuit 300 is supplying a synchronizing clock signal CLK, a data signal SDATA, and a load enable signal LEN as a control signal to the high-frequency LSI 200. When the load enable signal LEN is asserted to be at an effective level, the mode control circuit 290 sequentially acquires the data signal SDATA from the baseband circuit 300 at timing synchronized with the clock signal CLK and sets the data to the control register CRG. Although not particularly limited to, the data signal SDATA is serially transmitted. The baseband circuit 300 includes a microprocessor and the like.

The control register CRG includes, although not limited to, a bit to start the frequency measurement of the RFVCO 10 in the embodiment; bits to specify a reception mode, a transmission mode, an idle mode in which like in a wait state only some constituent components of the circuit operate and most constituent components thereof including at least the oscillator circuit do not operate in a sleep state and a warm-up which the PLL circuit is activated; and a bit to specify a pull-in mode in the transmission PLL circuit TxPLL.

Table 1 shows a setting example of frequencies of the oscillation signals φIF, φTX, and φRF respectively of the intermediate-frequency oscillator (IFVCO) 210, the transmission oscillator (TXVCO) 130, and the high-frequency oscillator (RFVCO) 10 in the triple-band high-frequency LSI of the embodiment.

TABLE 1

| | IFVCO (MHz) | TXIF (MHz) | TXVCO (MHz) | RXVCO (MHz) | |
| --- | --- | --- | --- | --- | --- |
| | | | | Reception | Transmission |
| GSM900 | 640 | 80 | 880 | 3700 | 3840 |
| | 640 | 80 | 915 | 3840 | 3980 |
| DCS1800 | 640 | 80 | 1710 | 3610 | 3580 |
| | 640 | 80 | 1785 | 3760 | 3730 |
| PCS1900 | 640 | 80 | 1850 | 3860 | 3860 |
| | 640 | 80 | 1910 | 3980 | 3980 |

As shown in Table 1, in this embodiment, the oscillation frequency of the intermediate-frequency oscillator (IFVCO) 210 is set to 640 MHz in either one of GSM, DCS, and PCS. The frequency is divided by the frequency dividing circuit 220 by eight to generate a carrier wave TXIF of 80 MHz and is then the signal modulation is carried out.

On the other hand, the oscillation frequency of the high-frequency oscillator (RFVCO) 10 is set to a range from 3840 MHz to 3980 MHz in GSM, to a range from 3580 MHz to 3730 MHz in DCS, and to a range from 3860 MHz to 3980 MHz in PCS. The frequency is divided by the frequency dividing circuit 250 by four in GSM and by two in DCS and PCS to be fed as φRF' to the mixer 260. The mixer 260 outputs a signal corresponding to a frequency difference (FRF−FTX) between φRF' and the frequency of the transmission oscillation signal φTX from the transmission oscillator circuit 130. The transmission PLL (TxPLL) operates so that a frequency of the difference signal matches a frequency FTXIF of the modulation signal.

The present invention of the inventor has been concretely described according to embodiments. However, the present invention is not restricted by the embodiments. For example, in the embodiments described above, the high-frequency LSI includes a storage circuit 18 to store the measured frequencies for the VCO 10 and a band decision circuit 19 for the VCO 10. However, it is also possible to dispose only the storage circuit 18 without using the band decision circuit 19 such that when the operation of the PLL circuit is started, the baseband circuit 300 reads information of the frequencies from the storage circuit 18 to determine a band for the VCO 10 to thereby produce the band change code (VB3 to VB0).

In the embodiments, although the dc voltage VDC is supplied via the loop filter 16 to the VCO 10 in the frequency measurement. However, the dc voltage VDC may be directly supplied to the VCO 10. In the embodiment of FIG. 6, the PLL circuit of the embodiment is applied to an RF PLL circuit to generate an RF signal (high-frequency signal) to be mixed by a mixer with a received signal. However, the PLL circuit is also applicable to an IF PLL circuit to generate an IF signal (an intermediate-frequency signal) to be mixed by a mixer with a transmission signal. Although not shown, the PLL circuit may also be applied to a transmission PLL circuit to generate a transmission signal in a high-frequency LSI of direct up-conversion system in which a transmission signal is directly modulated using the I and Q signals from the baseband circuit 300.

In the above description, the present invention of the inventor has been applied mainly to a PLL circuit employed in a wireless communication system of a mobile phone which is the background, i.e., the field of use thereof. However, the present invention is not limited to this field, but can be generally and broadly used for a semiconductor integrated circuit including a PLL circuit, particularly, for a semiconductor integrated circuit including a PLL circuit having a wide variable frequency range of the VCO.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

The invention claimed is:

1. A communication semiconductor integrated circuit device comprising:
   a phase-locked loop (PLL) circuit comprising an oscillator circuit for oscillating a signal in a plurality of frequency bands, a phase detection circuit configured to detect a difference between a phase of a reference frequency signal received from a reference oscillator circuit and a phase of said signal from said oscillator circuit, and charge pump and a filter capacitor for generating a voltage in response to output of said phase detection circuit;
   fixed voltage supply means for supplying a predetermined direct-current (dc) voltage as a control voltage of said oscillator circuit;
   a frequency counter, coupled to said oscillation circuit, for determining an oscillation frequency of said oscillator circuit;
   storage means for storing frequency information determined for each frequency band of said oscillator circuit;
   a control circuit which causes, in a state in which said PLL circuit is set to an open loop state, said oscillator circuit to conduct an operation of oscillation by a dc voltage from said fixed voltage supply means, to determine a frequency of the oscillation for each frequency band of said oscillator circuit, and causes said storage means to store the frequency.

2. A communication semiconductor integrated circuit device according to claim 1, further comprising a frequency band decision circuit for comparing the frequency information stored in said storage means with said specified frequency information and for generating a signal specifying an oscillation frequency band of said oscillator circuit, wherein
   said control circuit causes, in a state in which said PLL circuit is set to an open loop state, said oscillator circuit to conduct an operation of oscillation by a dc voltage from said fixed voltage supply means, determines a frequency of the oscillation for each frequency band of said oscillator circuit, causes said storage means to store the frequency, and causes, when said PLL is set to a closed loop state for operation, said oscillator circuit to conduct an operation of oscillation in said specified oscillation frequency band according to a signal from said frequency band decision circuit.

3. A communication semiconductor integrated circuit device according to claim 1, wherein said frequency counter measures an oscillation frequency of said oscillator circuit during one period or an integral multiple of the period of said reference frequency signal.

4. A communication semiconductor integrated circuit device according to claim 1, further comprising a counter circuit between said oscillator circuit and said phase comparator circuit, said counter circuit also serving as said frequency counter.

5. A communication semiconductor integrated circuit device according to claim 4, wherein:
   said counter circuit comprises a frequency dividing circuit configured to change a dividing ratio, a first programmable counter capable of counting a value equivalent to a quotient of a division in which a frequency of a signal to be produced from said oscillator circuit is divided by a frequency of said reference frequency signal and a result of the division is further divided by one of the dividing ratio of said frequency dividing circuit, and a second programmable counter capable of counting a value equivalent to a remainder of said division; and
   said storage circuit is configured to store a value calculated by said first programmable counter.

6. A communication semiconductor integrated circuit device according to claim 4, wherein said frequency band decision circuit compares the frequency information stored in said storage means with frequency information set to said first programmable counter and said second programmable counter and generates a signal specifying an oscillation frequency band of said oscillator circuit.

7. A communication semiconductor integrated circuit device according to claim 1, further comprising a mixer for mixing an oscillation signal outputted from said PLL circuit or a signal obtained by dividing a frequency of the oscillation signal with a received signal and thereby producing a demodulated signal.

8. A communication semiconductor integrated circuit device according to claim 1, further comprising a second mixer for mixing an oscillation signal output from said PLL circuit or a signal obtained by dividing a frequency of the oscillation signal with a transmission signal and thereby producing a signal having a frequency equivalent to a frequency difference therebetween.

9. A wireless communication system, comprising:
   a communication semiconductor integrated circuit device comprising:

a phase-locked loop (PLL) circuit configured to generate an oscillation signal of a frequency according to specified frequency information, said PLL circuit comprising a phase detection circuit for detecting a phase difference between a frequency signal as a reference and a feedback signal, and a charge pump and a filter capacitor for generating a voltage in response to the phase difference detected by said phase detection circuit, and an oscillator circuit for oscillating a signal in a plurality of frequency bands according to a voltage of said filter capacitor;

fixed voltage supply means capable of supplying a predetermined direct-current (dc) voltage as a control voltage of said oscillator circuit;

a frequency counter capable of measuring an oscillation frequency of said oscillator circuit;

storage means for storing frequency information measured for each frequency band of said oscillator circuit;

a control circuit which causes, in a state in which said PLL circuit is set to an open loop state, said oscillator circuit to conduct an operation of oscillation by a dc voltage from said fixed voltage supply means, to measure a frequency of the oscillation for each frequency band of said oscillator circuit, and causes said storage means to store the frequency; and a frequency band decision circuit which compares the frequency information stored in said storage means with said specified frequency information and for generates a signal specifying an oscillation frequency band of said oscillator circuit, said control circuit causing, in a state in which said PLL circuit is set to an open loop state, said oscillator circuit to conduct an operation of oscillation by a dc voltage from said fixed voltage supply means, measuring a frequency of the oscillation for each frequency band of said oscillator circuit, causing said storage means to store the frequency, and causing, when said PLL is set to a closed loop state for operation, said oscillator circuit to conduct an operation of oscillation in said specified oscillation frequency band according to a signal from said frequency band decision circuit; and a baseband circuit for extracting data from a received signal down-converted to a desired frequency by said communication semiconductor integrated circuit device and for converting transmission data into an I signal and a Q signal, wherein the specified frequency information is fed from said baseband circuit to said communication semiconductor integrated circuit device.

10. A wireless communication system according to claim 9, wherein said system is configured to communicate signals in a communication method using at least two frequency bands including Global System for Mobile Communication (GSM) in a frequency band of at least 980 megahertz (MHz).

* * * * *